United States Patent
Lu et al.

(10) Patent No.: US 9,146,459 B2
(45) Date of Patent: Sep. 29, 2015

(54) EXTREME ULTRAVIOLET LITHOGRAPHY PROCESS AND MASK

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsin-Chu (TW); Jeng-Horng Chen, Hsin-Chu (TW); Anthony Yen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 14/087,508

(22) Filed: Nov. 22, 2013

(65) Prior Publication Data

US 2015/0147686 A1    May 28, 2015

(51) Int. Cl.
*G03F 1/24*     (2012.01)
*G03F 1/48*     (2012.01)
*G03F 7/20*     (2006.01)

(52) U.S. Cl.
CPC .. *G03F 1/24* (2013.01); *G03F 1/48* (2013.01); *G03F 7/2002* (2013.01); *G03F 7/2022* (2013.01)

(58) Field of Classification Search
CPC ........... G03F 1/24; G03F 1/48; G03F 7/2002; G03F 7/2022
USPC ............................................................ 430/5
See application file for complete search history.

(56) References Cited

PUBLICATIONS

G.F. Lorusso and E. Hendrickx et al., "Metrology development for extreme ultraviolet lithography: Flare and out-of-band qualification," Journal of Vacuum Science & Technology B: Microelectroincs and Nanometer Structures (vol. 29, Issue 6). Nov. 2011, pp. 06F505-06F505-7.

Sang H. Lee et al., "Lithographic Flare Measurements of EUV Full-Field Projection Optics," Emerging Lithographic Technologies VII, Roxann L. Engelstad, Editor, SPIE vol. 5037 (2003), 9 pages.

Yen-Cheng Lu et al., U.S. Appl. No. 14/020,302, filed Sep. 6, 2013, as "Extreme Ultraviolet Lithography Process and Mask," 19 pages of text, 7 pages of drawings.

*Primary Examiner* — Christopher Young
(74) *Attorney, Agent, or Firm* — Haynes and Boone, LLP

(57) ABSTRACT

A low EUV reflectivity mask includes a low thermal expansion material (LTEM) layer, a low EUV reflectivity (LEUVR) multilayer over the LTEM layer in a first region, a high EUV reflectivity (HEUVR) multilayer over the LTEM layer in a second region and a patterned absorption layer over the LEUVR multilayer and the HEUVR multilayer.

20 Claims, 7 Drawing Sheets

EXTREME ULTRAVIOLET LITHOGRAPHY PROCESS AND MASK

CROSS-REFERENCE

This patent application is related to U.S. Ser. No. 14/020,302 filed Sep. 6, 2013, and titled, "Extreme Ultraviolet Lithography Process And Mask," the entire disclosure of which is hereby incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As the size of a device feature, such as gate length, has decreased, numerous challenges have risen. High resolution lithography processes are often one of the more important areas to decreasing feature size, and improvements in this area are generally desired. One lithography technique is extreme ultraviolet (EUV) lithography. Other techniques include X-Ray lithography, ion beam projection lithography, electron beam projection lithography, and multiple electron beam maskless lithography.

EUV lithography is a promising patterning technology for semiconductor technology nodes with very small feature sizes, such as 14-nm, and beyond. EUV lithography is very similar to optical lithography in that it uses a mask to print wafers. However, unlike optical lithography, EUV employs light in the EUV region, e.g., at about 13.5 nm. At the wavelength of 13.5 nm, most materials are highly absorbing. Thus, reflective optics, rather than refractive optics, are commonly used in EUV lithography. Although existing methods of EUV lithography have been generally adequate for their intended purposes, they have not been entirely satisfactory in all respects. For example, the EUV light produced by plasma, such as DPP (discharge-produced plasma) and LPP (laser-produced plasma), emits some out of band (OOB) radiation. A portion of the OOB radiation (sometimes referred to as a flare) can also arrive at the target substrate (e.g., a wafer) and cause image contrast loss. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
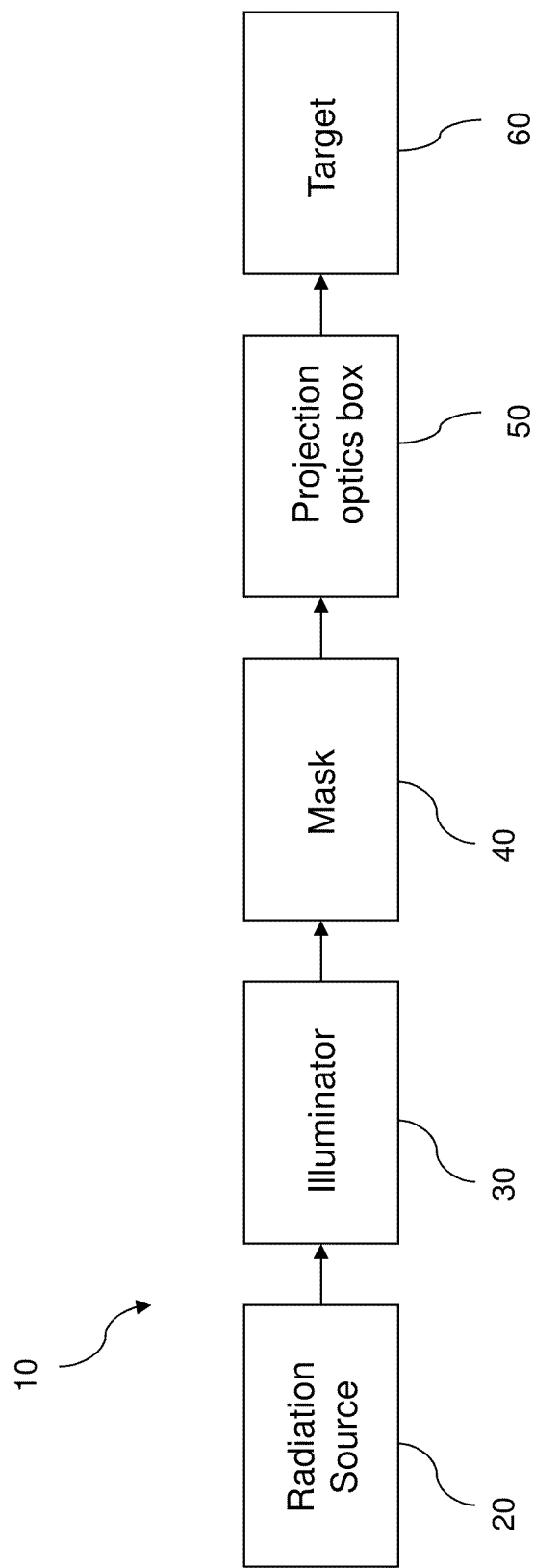
FIG. 1 is a block diagram of a lithography process for implementing one or more embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and dose not in itself dictate a relationship between the various embodiments and/or configurations discussed.

Further, spatially relative terms, such as "beneath", "below", "lower", "above", "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 10 that may benefit from one or more embodiments of the present invention is disclosed. The EUV lithography process 10 employs an EUV radiation source 20, including an EUV wavelength of about 13.5 nm.

The EUV lithography process 10 also employs an illuminator 30. The illuminator 30 may comprise reflective optics, such as a single mirror or a mirror system having multiple mirrors in order to direct light from the radiation source 20 onto a mask 40. In the EUV wavelength range, reflective optics is employed generally. Refractive optics, however, can also be realized by zoneplates.

The EUV lithography process 10 also employs a mask 40 (the terms mask, photomask, and reticle are used herein to refer to the same item), or multiple masks. In the present embodiment, the mask 40 is a reflective mask. The mask 40 may incorporate other resolution enhancement techniques such as optical proximity correction (OPC). The mask 40 will be described in further detail later.

The EUV lithography system and process 10 also employs a projection optics box (POB) 50. The POB 50 may have refractive optics or reflective optics. The radiation reflected from the mask 40 (e.g., a patterned radiation) is collected by the POB 50.

The target 60 includes a semiconductor wafer with a photosensitive layer (e.g., photoresist layer or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

The EUV exposure light source may contain some of out of band radiation (OOB) and a part of this radiation can reach the wafer surface (sometimes referred to as a flare) and cause a reduction in image contrast. Compared with EUV, the OOB radiation which can reach the wafer surface may have a longer wavelength, such as deep ultraviolet (DUV) wavelength. So, a stray light level of DUV flare could be much lower than that of EUV. In an EUV lithography process, it is important to evaluate the impact of DUV flares for better optical simulation and prediction, and to form a strategy to suppress this impact. Also, the DUV flare in an EUV scanner may be a local flare rather than stray light caused by non-pure illumination wavelength. The impact of this type of DUV flare may depend on such things as the mask structure and pattern density. A method for evaluating this local flare, and distinguishing different types of flares, is described below.

The following description refers to the mask 40 and mask fabrication process. The mask fabrication process usually includes two steps: a mask substrate fabrication process and a mask patterning process. A mask substrate is formed by a stack of layers (e.g., multiple reflective layers). The mask substrate is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of more than 50 masks) may be used to construct a complete IC device.

Figure 2:
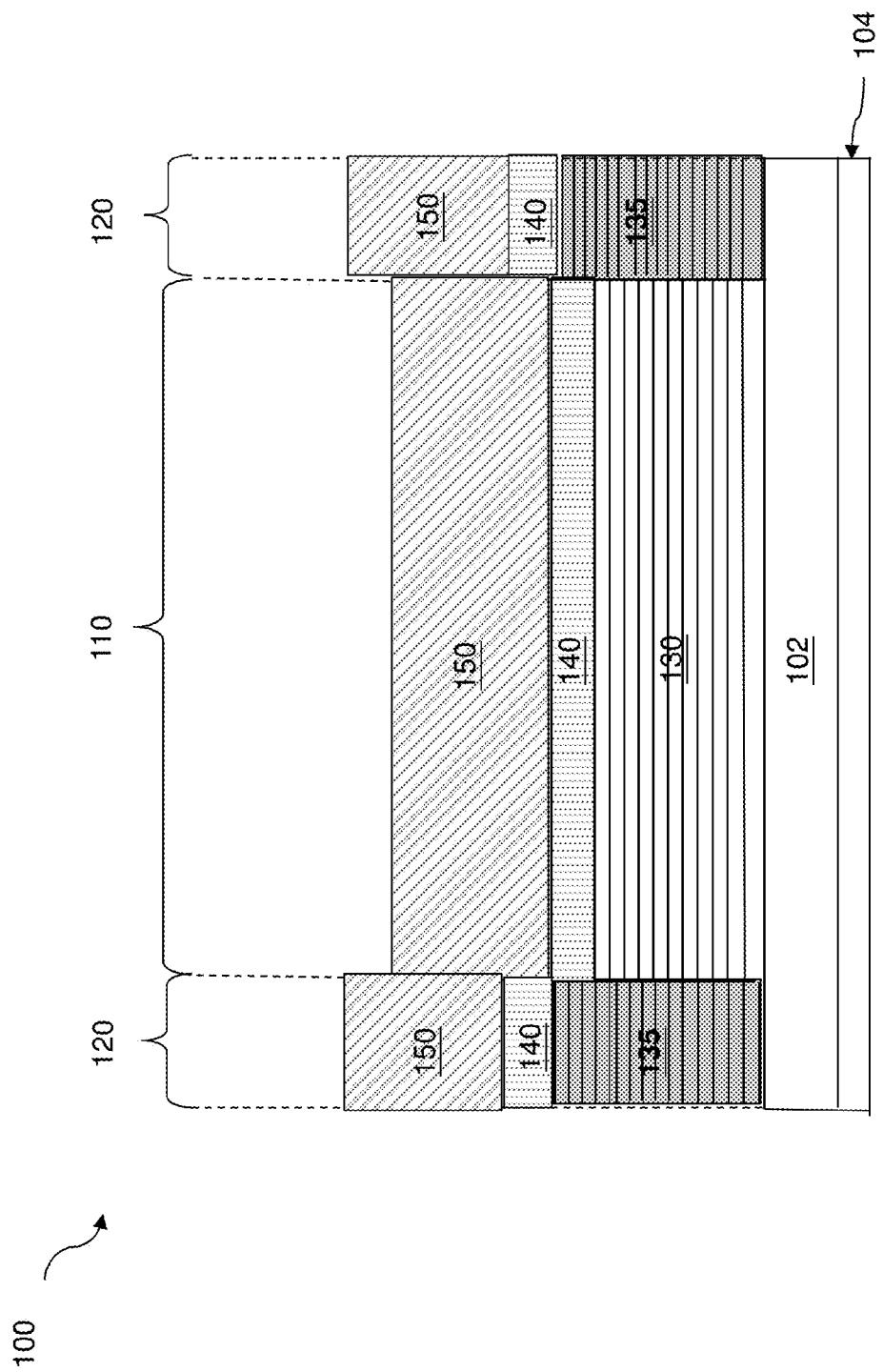
FIG. 2 is a diagrammatic cross-sectional view of a mask substrate at various stages of a lithography process constructed according to aspects of the present disclosure.

Referring to FIG. 2, a mask substrate 100 includes a material layer 102 made of low thermal expansion material (LTEM). The LTEM material includes $TiO_2$, doped $SiO_2$, and/or other low thermal expansion materials known in the art. The LTEM layer 102 serves to minimize image distortion due to mask heating. In the present embodiment, the LTEM layer 102 includes materials with a low defect level and a smooth surface. In addition, a conductive layer 104 may be deposited under (as shown in the figure) the LTEM layer 102 for electrostatic chucking the mask. In an embodiment, the conductive layer 104 includes chromium nitride (CrN), though other compositions are possible.

In the present embodiment, the mask substrate 100 has two regions, a first region 110 and a second region 120. The second region 120 includes edge region of the mask substrate 100. In the first region 110, a low EUV reflectivity (LEUVR) multilayer 130 is formed over the LTEM layer 102. For example, the reflectivity of the LEUVR multilayer 130 is less than 2%. In one embodiment, the LEUVR multilayer 130 includes forty pairs of films of 1.5 nm molybdenum (Mo) and 2 nm silicon (Si). In another embodiment, the LEUVR multilayer 130 includes 280 nm MoSi. In yet another embodiment, the LEUVR multilayer 130 is includes forty pairs of films of 4.5 nm Mo and 6 nm Si.

In the second region 120, a high EUV reflectivity (HEUVR) multilayer 135 is formed over the LTEM layer 102. The HEUVR multilayer 135 includes a plurality of film pairs, such as molybdenum-silicon (Mo/Si) film pairs (e.g., a layer of molybdenum above or below a layer of silicon in each film pair). Alternatively, the HEUVR multilayer 135 may include molybdenum-beryllium (Mo/Be) film pairs, or any material pair that is highly reflective at EUV wavelengths can be utilized for the HEUVR multilayer 135. The thickness of each layer of the HEUVR multilayer 135 depends on the EUV wavelength and the incident angle and is adjusted to achieve a maximum constructive interference of the EUV light reflected at each interface and a minimum absorption of the EUV light by the HEUVR multilayer 135. The HEUVR multilayer 135 may be selected such that it provides a high reflectivity to a selected radiation type/wavelength. A typical number of film pairs is 5-60, however any number of film pairs is possible. The HEUVR multilayer 135 usually achieves a reflectance of at least 0.2 or above. In an embodiment, the HEUVR multilayer 135 includes forty pairs of layers of Mo/Si. Each Mo/Si film pair has a thickness of about 7 nm, with a total thickness of 280 nm. In this case, a reflectivity of about 70% is achieved. In one embodiment, the HEUVR multilayer 135 is configured as forty pairs of films of 3 nm Mo and 4 nm Si. In one embodiment, the first region 110 is surrounded by the second region 120. In another embodiment, the second region 120 is at an edge of a mask. With a high EUV reflectivity, the second region 120 can provide an adequate intensity of a reflected light for an alignment process in an EUV lithography process.

In one embodiment, the LEUVR multilayer 130 is formed over the LTEM layer 102, in both of the first and the second regions, 110 and 120. The LEUVR multilayer 130 is then to be removed in the second region 120 by proper processes, such as patterning and etching processes. The HEUVR multilayer 135 is then formed in the second region 120 by proper deposition techniques. In another embodiment, the LEUVR multilayer 130 is formed over the LTEM layer 102, in both of first and second regions, 110 and 120. The HEUVR multilayer 135 is then formed over the LEUVR multilayer 130 in the second region 120 by proper deposition techniques. Thus, a final multilayer in the second region 120 is formed by having the LEUVR multilayer 130 as its bottom portion and the HEUVR multilayer 135 as its upper portion. In this embodiment, the HEUVR multilayer 135 includes 5-10 pairs of layers of Mo/Si. Each Mo/Si film pair has a thickness of about 7 nm.

The mask substrate 100 may also include a capping layer 140 disposed above the LEUVR multilayer 130 and the HEUVR multilayer 135 to prevent oxidation. In one embodiment, the capping layer 140 includes ruthenium (Ru), Ru compounds such as RuB, RuSi, chromium (Cr), Cr oxide, and Cr nitride. The capping layer 140 has a thickness of about 2.5 nm. Alternatively, in one embodiment, the capping layer 140 is formed over the HEUVR multilayer 135 and not over the LEUVR multilayer 130.

The mask substrate 100 also includes an absorption layer 150 formed above the capping layer 140 in the first region 110 and the second region 120. The absorption layer 150 includes multiple film layers with each film containing chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, molybdenum, other suitable materials, or mixture of some of the above. In one embodiment, the absorption layer 150 includes 70 nm tantalum boron nitride (TaBN). In another embodiment, the absorption layer 150 includes 56 nm tantalum boron nitride (TaBN) and 14 nm tantalum boron oxide (TaBO) deposited over the TaBN layer.

One or more of the layers 104, 130, 135, 140 and 150 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art.

Figure 3:
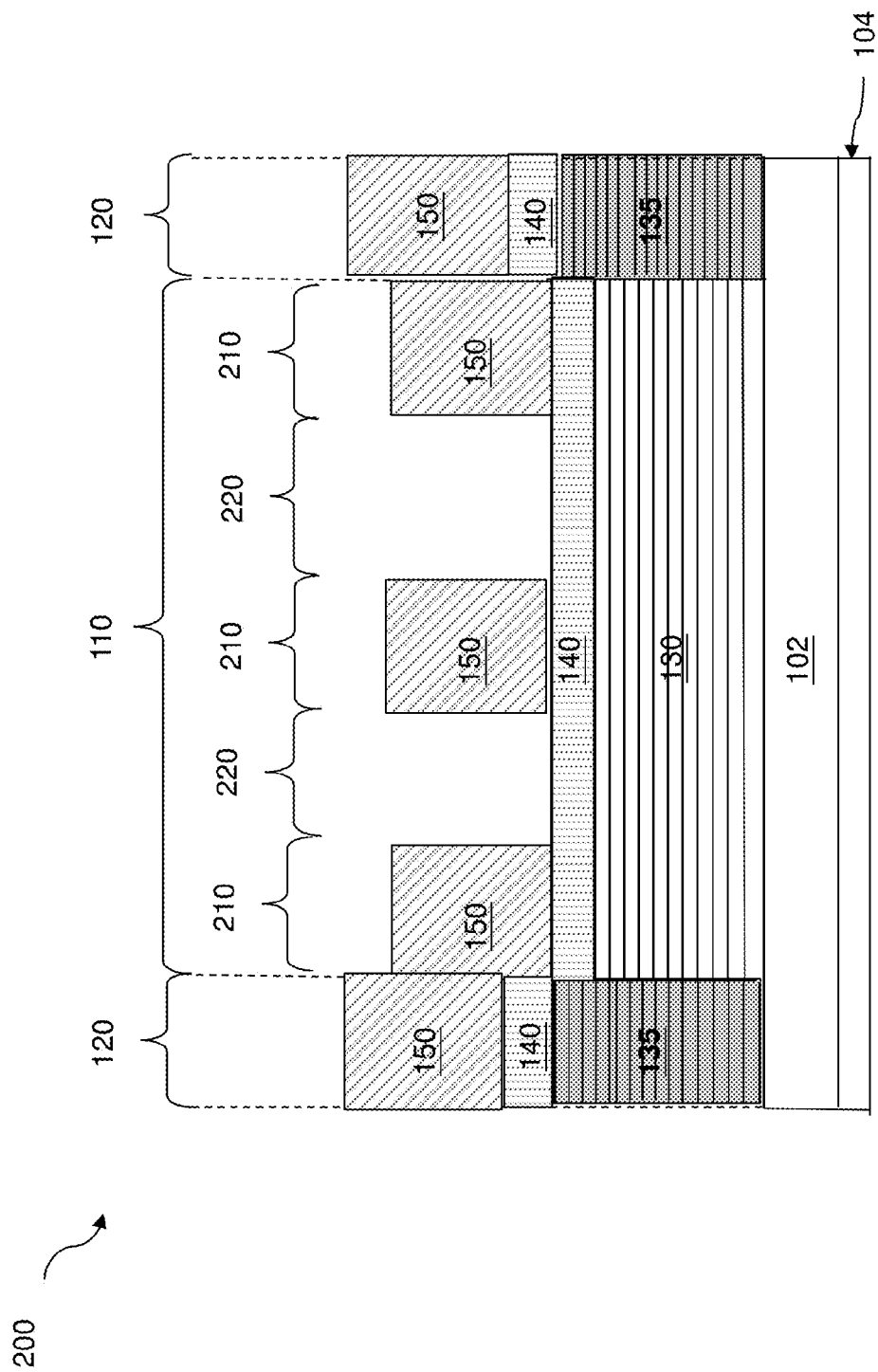
FIG. 3 is a diagrammatic cross-sectional view of a low EUV reflectivity (LEUVR) mask at various stages of a lithography process constructed according to aspects of the present disclosure.

Referring to FIG. 3, the absorption layer 150 is patterned to form a low EUV reflectivity (LEUVR) mask 200 having a first sub-region 210 and a second sub-region 220 in the first region 110. In the first sub-region 210, the absorption layer 150 remains while in the second sub-region 220, it is removed. In some cases, the first sub-region 210 is referred to as absorptive region and the second sub-region 220 as a reflective region. The absorption layer 150 can be patterned by patterning and etching processes. The etching process may include dry (plasma) etching, wet etching, and/or other etching methods. For example, the dry etching process may implement a fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), iodine-containing gas, other suitable gases and/or plasmas, and/or combinations thereof. Alternative patterning processes include maskless photolithography, electron-beam writing, direct-writing, and/or ion-beam writing.

Figure 4:
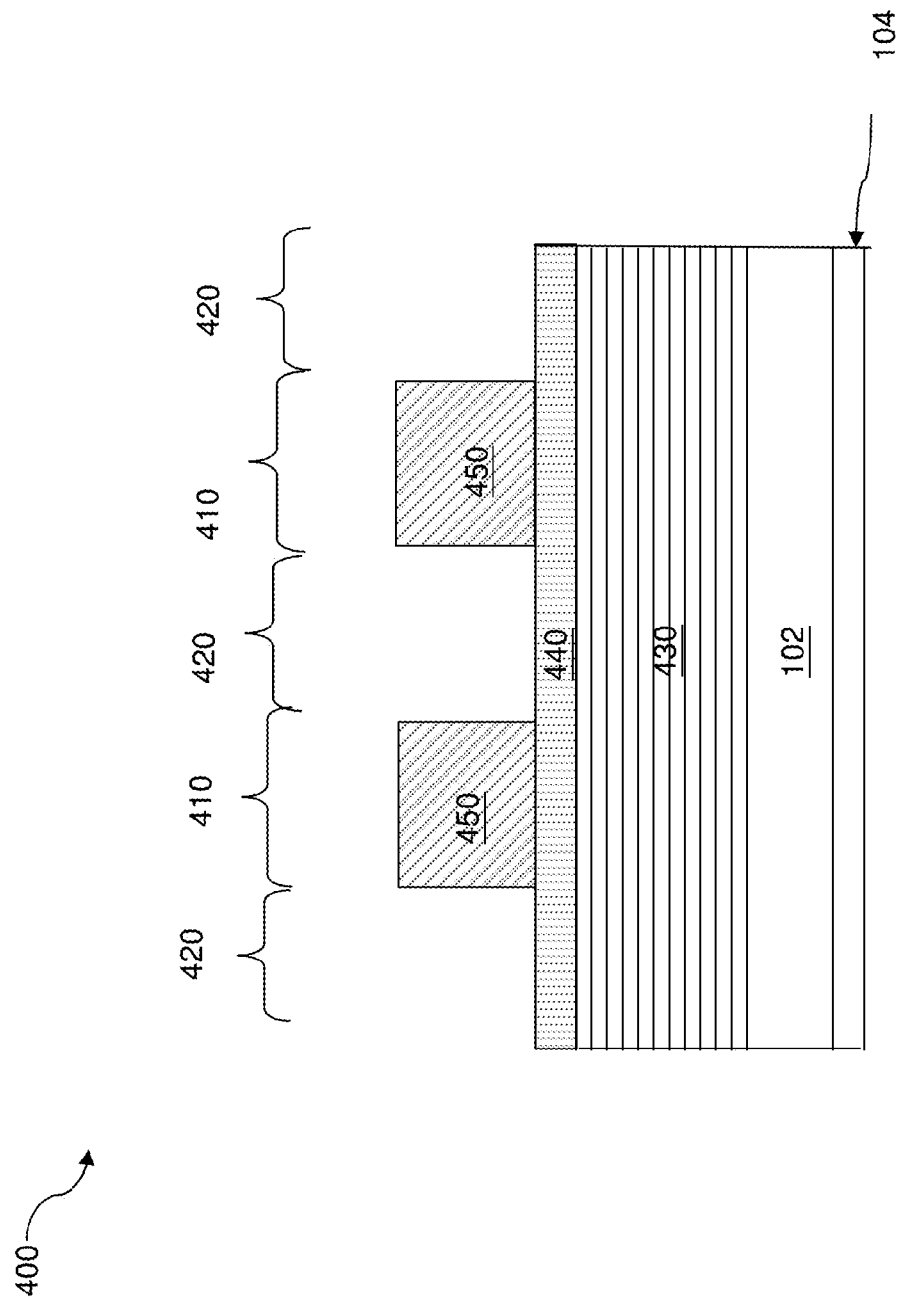
FIG. 4 is a diagrammatic cross-sectional view of an EUV mask at various stages of a lithography process constructed according to aspects of the present disclosure.

Referring to FIG. 4, an EUV mask 400 is formed similarly in many respects to the LEUVR mask 200 discussed above in FIGS. 2 and 3, except it has a high EUV reflectivity (HEUVR) multilayer 430 over the entire LTEM layer 102. In one embodiment, the HEUVR multilayer 430 is the same as the HEUVR multilayer 135. The EUV mask 400 may include a capping layer 440 deposited over the HEUV multilayer 430. The EUV mask 400 has a patterned absorption layer 450 to define two regions, an absorptive region 410 and a reflective region 420. In the absorptive region 410, the absorption layer 450 remains while in the reflective region 420, it is removed. In one embodiment, the patterned absorption layer 450 has a same pattern as the one of the patterned absorption layer 150 in the LEUVR mask 200.

The LEUVR mask 200 and the EUV mask 400 may also incorporate other resolution enhancement techniques such as an optical proximity correction (OPC). The LEUVR mask 200 and the EUV mask 400 may also undergo a defect repair process by a mask defect repair system. The mask defect repair system is a suitable system, such as an e-beam repair system and/or a focused ion beam (FIB) repair system.

Figure 5:
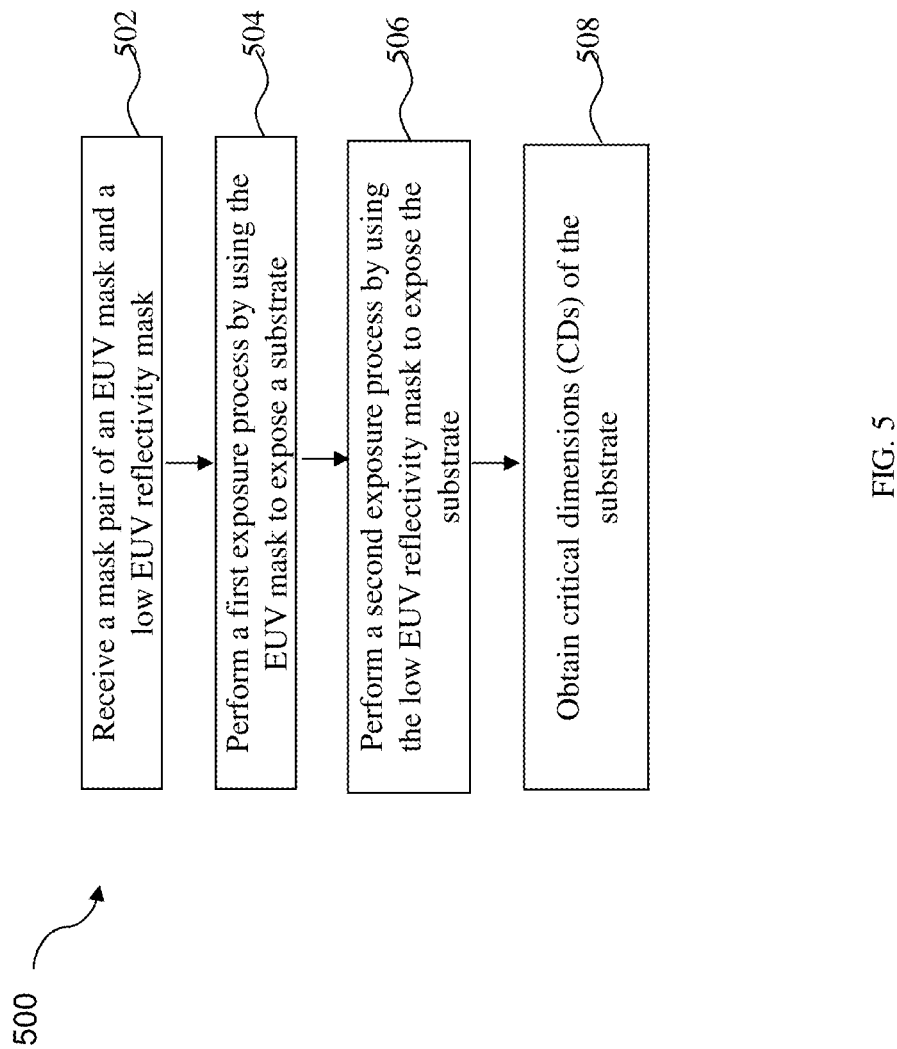
FIG. 5 is a flow chart of an example method for evaluating deep ultraviolet (DUV) flare impact according to various aspects of the present disclosure.
Figure 6B:
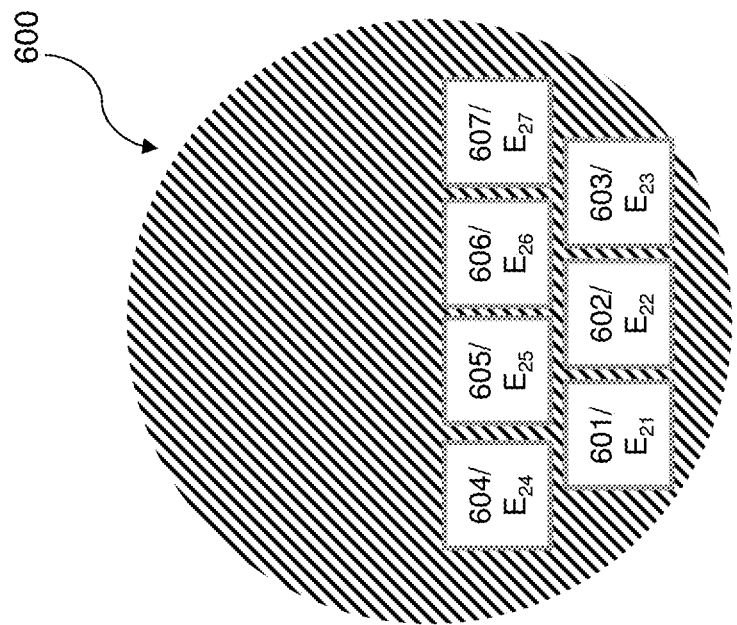
FIGS. 6A and 6B are top schematic views of patterning a substrate using different masks in the method of FIG. 5 according to various aspects of the present disclosure.
Figure 6A:
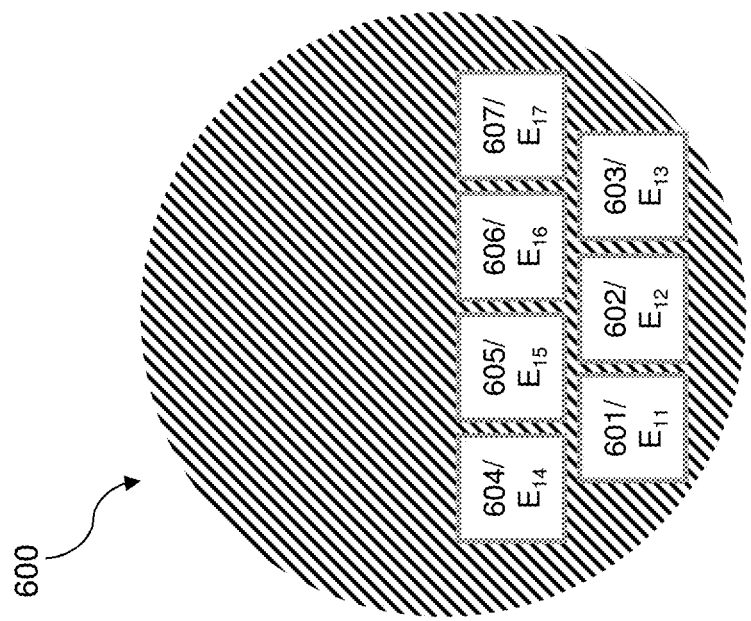

FIG. 5 is a flowchart of a method 500 of evaluating DUV flare impacts constructed according to aspects of the present disclosure. FIGS. 6A and 6B are diagrammatic top views of patterning a target 600 at various stages of the method 500.

The method 500 begins at step 502 by providing the EUV mask 400 having a first EUV reflectivity $r_1$ and the LEUVR mask 200 having a second EUV reflectivity $r_2$. In the present example, the EUV mask 400 and the LEUVR mask 200 have the same absorption patterns.

Referring FIGS. 5 and 6A, the method 500 proceeds to step 504 by performing a first exposure process using the EUV mask 400 on a substrate 600 by an EUV scanner. In the present embodiment, the EUV scanner employs an EUV radiation carrying an OOB radiation. The first exposure process starts at a first region 601 in the substrate 600 coated with a photoresist layer, then a second exposure process is performed at a second region 602, then a third exposure process is performed at a third region 603, and so on. In the present embodiment, the first exposure process is conducted according to a first exposure dose matrix. The first exposure dose matrix is configured such that, through the EUV mask 400, an exposure dose $E_{11}$ is used to expose the first region 601, an exposure dose $E_{12}$, which is equal to $E_{11}-\Delta$, is used to expose the second region 602 (here $\Delta = r_2/r_1 \times E_{11}$); an exposure dose $E_{13}$, which is equal to $E_{11}-2\Delta$, is used to expose the third region 603; and so on. In summary, an exposure dose $E_{1N}$ is equal to $E_{11}-(N-1)\Delta$ to expose the $N^{th}$ region 60N.

In one embodiment, the $E_{11}$ is an optimized exposure dose (Eop) for the EUV mask 400. The Eop may be determined based on an exposure dose for the pattern of the EUV mask 400 to achieve a pre-specified target dimension on the substrate 600 under a corresponding single exposure process. The Eop may vary according to pattern density of the EUV mask 400. Thus $E_{12}$ is equal to Eop$-\Delta$, $E_{13}$ is equal to Eop$-2\Delta$ ... $E_{1N}$ is equal to Eop$-(N-1)\Delta$.

With the first EUV reflectivity $r_1$ of the EUV mask 400, an exposure dose $E_{1N}$ received by the region 60N of the substrate 600 is about $r_1 \times E_{11} - r_2(N-1)E_{11}$. When the exposure dose has both the EUV dose and OOB flare dose, the $E_{1N}$ is about $r_1 \times E_{11EUV} - r_2(N-1) E_{11EUV}$ plus $E_{11OOB} - (N-1) (r_2/r_1) E_{11OOB}$. $E_{11EUV}$ represents an EUV dose portion of $E_{11}$ and $E_{11OOB}$ represents an OOB flare dose portion of $E_{11}$. In the present embodiment, considering the OOB flare dose $E_{11DUV}$ is substantially smaller than the EUV dose $E_{11EUV}$ in the EUV scanner, and $r_2$ is substantially smaller than $r_1$, it is a fair estimation that the exposure dose $E_{1N}$ received by the region 60N is close to $r_1 \times E_{11EUV} - r_2(N-1) E_{11EUV}$ plus $E_{11OOB}$. As an example, when the exposure dose has EUV dose and DUV flare dose, the region 601 receives an exposure dose of $r_1 \times E_{11EUV}$ plus $E_{11OOB}$; the region 602 receives an exposure dose of $r_1 \times E_{11EUV} - r_2 \times E_{11EUV}$ plus $E_{11OOB}$; the region 603 receives an exposure dose of $E_{11EUV} - 2 r_2 \times E_{11EUV}$ plus $E_{11OOB}$; ..., and the region 60N receives an exposure dose of $r_1 \times E_{11EUV} - r_2(N-1)E_{11EUV}$ and $E_{11OOB}$.

Referring FIGS. 5 and 6B, the method 500 proceeds to step 506 by performing second exposure using the LEUVR mask 200 on the substrate 600 by the same EUV scanner having the same radiation. In the present embodiment, the second exposure process is conducted according to a second exposure dose matrix. The second exposure dose matrix is configured such that, through the LEUVR mask 200, a zero exposure dose is used to expose the first region 601, an exposure dose $E_{22}$, which is equal to $E_{11}$, is used to expose the second region 602; an exposure dose $E_{23}$, which is equal to $2E_{11}$, is used to expose the third region 603 ..., and an exposure dose $E_{2N}$, which is equal to $(N-1) E_{11}$, is used to expose the $N^{th}$ region 60N.

With the second EUV reflectivity $r_2$ of the LEUVR mask 200, the exposure dose received by the $N^{th}$ region 60N is close to $r_2 \times (N-1)E_{11EUV}$ and $(N-1)E_{11OOB}$. As an example, the region 601 receives a zero dose; the region 602 receives an exposure dose of $r_2 \times E_{11EUV}$ and $E_{11DUV}$; the region 603 receives an exposure dose of $2r_2 \times E_{11EUV}$ and $2E_{11EUV}$; ..., the region 60N receives an exposure dose of $r_2(N-1) E_{11EUV}$ and $(N-1)E_{11DUV}$. In present embodiment, considering $r_2$ is substantially small, it is a fair estimation that the exposure dose received by the region 60N is close to $r_2(N-1)E_{11EUV}$ plus $(N-1) E_{11OOB}$.

Thus after the first and second exposure processes, a total exposed dose $E_T$ received by each region of the substrate 600 is close to a sum of EUV dose and OOB flare dose received in these two exposures through the two masks, respectively. Considering the OOB flare dose is substantially smaller than the EUV dose in the EUV scanner and $r_2$ is substantially smaller than $r_1$, it is a fair estimation that $E_{T1}$ received by the region 601 is close to $r_1 \times E_{11EUV} + E_{11OOB}$; $E_{T2}$ received by region 602 is close to $r_1 \times E11_{EUV} + 2E_{11OOB}$; $E_{T3}$ received by the region 603 is close to $r_1 \times E_{11EUV} + 3E_{11OOB}$; . . . ; $E_{TN}$ received by the region 60N is close to $r_1 \times E_{11EUV} + N \times E_{11OOB}$. For example, when the exposure dose has an EUV dose and a DUV flare dose, $E_{TN}$ received by the region 60N is close to $r_1 \times E_{11EUV} + N \times E_{11DUV}$. In other words, each region in the substrate 600 receives a substantial same EUV exposure dose, $r_1 \times E_{11EUV}$, and a different OOB flare dose, $N \times E_{11OOB}$.

Referring to FIG. 5, the method 500 proceeds to step 508 by obtaining critical dimension (CD) data for each region of the substrate 600. After performing the first and the second exposure process, a developing process is performed on the photoresist layer of the substrate 600. During the developing process, a developing solution is applied to the photoresist layer. In an example, the developing solution is a basic solution, such as tetramethylammonium hydroxide (TMAH). The developing solution removes exposed or unexposed portions of the photoresist layer depending on the resist material. For example, the photoresist layer includes positive-tone resist material, so the developing process removes (dissolves) the exposed portions of the photoresist layer and leave the unexposed portions of the photoresist layer over the substrate 600. Alternatively, where the photoresist layer includes negative-tone resist material, the developing process removes (dissolves) the unexposed portions of the photoresist layer and leave the exposed portions of the photoresist layer over the substrate 600. A rinsing process, such as a de-ionized (DI) water rinse. The rinsing process may remove residue particles.

Figure 7:
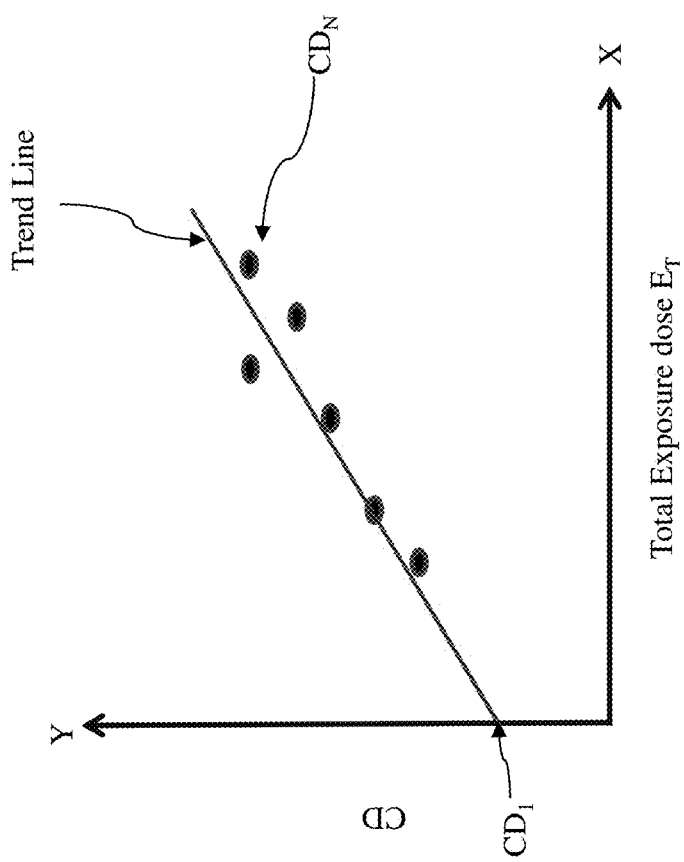
FIG. 7 is a chart of critical dimension (CD) vs. DUV flare according to various aspects of the present disclosure.

A CD measurement is performed to obtain $CD_1$ of the first region 601, $CD_2$ of the second region 602, $CD_3$ of the second region 603, . . . $CD_N$ of the Nth region 60N. A relationship between each $CD_N$ and a corresponding total exposure dose $E_T$ may be studied by any suitable method to evaluate DUV flare impacts, produced by the EUV scanner, on the EUV mask 400 (with its mask structure and pattern density). As an example, a plot of CD vs. total exposure dose $E_T$ is formed with total exposure dose $E_T$ as its X-axis and CD as its Y-axis. A trend line of CD vs. total exposure dose $E_T$ may be obtained as well from the plot. Since the EUV exposure dose received by each region in the substrate 600 is substantially same and variations of the total exposure dose $E_T$ represent mainly variations of DUV flare, the difference between Y-axis intercept and $CD_1$ is proportional to DUV level, as shown in FIG. 7. This can be performed on a computer using software stored in memory and executed by a processor.

Additional steps can be provided before, during, and after the method 500, and some of the steps described can be replaced, eliminated, or moved around for additional embodiments of the method 500.

Based on the above, the present disclosure offers an EUV lithography process to evaluate DUV flare impact on an EUV mask exposed by an EUV scanner. The process employs a mask pair having same absorption layer pattern but different EUV reflectivity. The mask pair has a low EUV reflectivity mask and an EUV mask. The low EUV reflectivity mask has a high EUV reflectivity region (i.g edge of the mask). The process also employs two exposure dose matrixes for multiple exposure processes using the mask pair to reveal DUV flare impact on the EUV mask by the EUV scanner.

The present disclosure is directed towards masks. In one embodiment, a low EUV reflectivity mask includes a low thermal expansion material (LTEM) layer, a low EUV reflectivity (LEUVR) multilayer over the LTEM layer in a first region, a high EUV reflectivity (HEUVR) multilayer over the LTEM layer in a second region and a patterned absorption layer over the LEUVR multilayer and the HEUVR multilayer.

The present disclosure is also directed towards lithography systems and processes. In one embodiment, an extreme ultraviolet lithography (EUVL) process includes receiving a mask pair having a same pattern. The mask pair includes an extreme ultraviolet (EUV) mask having a first EUV reflectivity $r_1$ and a low EUV reflectivity mask having a second EUV reflectivity $r_2$. The process also includes receiving a substrate coated with a photoresist layer, receiving an EUV scanner equipped with an EUV radiation. The process also includes performing a first exposure process to the substrate, by using the EUV scanner and the EUV mask. The first exposure process is conducted according to a first exposure dose matrix. The process also includes performing a second exposure process to the substrate, by using the EUV scanner and the low EUV reflectivity mask. The second exposure process is conducted according to a second exposure dose matrix.

In another embodiment, a mask includes a low thermal expansion material (LTEM) layer, a first extreme ultraviolet reflectivity (EUVR) multilayer over the LTEM layer. The first EUVR multilayer has an EUV reflectivity larger than 30%. The mask also includes a second extreme ultraviolet reflectivity (EUVR) multilayer over a portion of the first EUVR to form a third EUVR multilayer. Therefore the third EUVR multilayer has the first EUVR as its bottom portion and the second EUVR as its upper portion. The third EUVR multilayer has an EUV reflectivity less than 2%. The mask also includes a patterned absorption layer over the first EUVR multilayer and the second EUVR multilayer.

The foregoing outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A low extreme ultraviolet reflective (LEUVR) mask comprising:
   a low thermal expansion material (LTEM) layer;
   a low extreme ultraviolet reflectivity (LEUVR) multilayer over a first region of the LTEM layer;
   a high extreme ultraviolet reflectivity (HEUVR) multilayer over a second region of the LTEM; and
   a patterned absorption layer over the LEUVR multilayer and the HEUVR multilayer.

2. The mask of claim 1, wherein the LEUVR multilayer has less than 2% EUV reflectivity.

3. The mask of claim 1, wherein the HEUVR multilayer has more than 30% EUV reflectivity.

4. The mask of claim 1, wherein the LEUVR multilayer includes forty film pairs, each film pair including a first film including about 1.5 nm molybdenum (Mo) and a second film including about 2 nm silicon (Si).

5. The mask of claim 1, wherein the LEUVR multilayer includes forty film pairs, each film pair including a first film including about 4.5 nm molybdenum (Mo) and a second film including about 6 nm silicon (Si).

6. The mask of claim 1, wherein the LEUVR multilayer includes a molybdenum silicon (MoSi) layer of about 280 nm thickness.

7. The mask of claim 1, further comprising:
a capping layer over the LEUVR multilayer and the HEUVR multilayer.

8. The mask of claim 7, wherein the capping layer includes about 2.5 nm thickness of ruthenium (Ru).

9. The mask of claim 1, wherein the first region is surrounded by the second region.

10. The mask of claim 1, wherein the patterned absorption layer includes about 70 nm thickness of tantalum boron nitride (TaBN).

11. The mask of claim 1, wherein the patterned absorption layer includes about 56 nm thickness of tantalum boron nitride (TaBN) and about 14 nm thickness of tantalum boron oxide (TaBO) deposited over the TaBN layer.

12. The mask of claim 1, wherein the HEUVR multilayer includes about forty pairs of films of about 3 nm thickness of molybdenum (Mo) and about 4 nm thickness of silicon (Si).

13. A low extreme ultraviolet reflective (LEUVR) mask comprising:
a low thermal expansion material (LTEM) layer;
a first extreme ultraviolet reflectivity (EUVR) multilayer over the LTEM layer, having an EUV reflectivity larger than 30%;
a second extreme ultraviolet reflectivity (EUVR) multilayer over a portion of the first EUVR to form a third EUVR multilayer, which has the first EUVR as its bottom portion and the second EUVR as its upper portion, wherein the third EUVR multilayer has an EUV reflectivity less than 2%; and
a patterned absorption layer over the first EUVR multilayer and the second EUVR multilayer.

14. A photolithographic mask comprising:
a base material;
a first reflective structure disposed on the base material;
a second reflective structure disposed on the base material and alongside the first reflective structure, wherein the second reflective structure has a different composition than the first reflective structure; and
an absorptive layer disposed on both the first reflective structure and the second reflective structure.

15. The photolithographic mask of claim 14, wherein the first reflective structure is configured to have a greater reflectivity to extreme ultraviolet radiation than the second reflective structure.

16. The photolithographic mask of claim 15, wherein the first reflective structure has at least 30% reflectivity with respect to extreme ultraviolet radiation, and wherein the second reflective structure has less than 2% reflectivity with respect to extreme ultraviolet radiation.

17. The photolithographic mask of claim 14 further comprising a first portion of a capping layer disposed between the first reflective structure and the absorptive layer and a second portion of the capping layer disposed between the second reflective structure and the absorptive layer, wherein the first portion of the capping layer is disposed at a different distance from the base material than the second portion of the capping layer.

18. The photolithographic mask of claim 17, wherein the first portion of the capping layer is disposed further from the base material than the second portion of the capping layer.

19. The photolithographic mask of claim 14, wherein a lower surface of the absorptive layer disposed directly over the first reflective structure is vertically offset from a lower surface of the absorptive layer disposed directly over the second reflective structure.

20. The photolithographic mask of claim 19, wherein the lower surface of the absorptive layer disposed directly over the first reflective structure is further from the base material than the lower surface of the absorptive layer disposed directly over the second reflective structure.

* * * * *